(12) United States Patent
Derraa

(10) Patent No.: US 7,067,416 B2
(45) Date of Patent: Jun. 27, 2006

(54) METHOD OF FORMING A CONDUCTIVE CONTACT

(75) Inventor: Ammar Derraa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 09/941,533

(22) Filed: Aug. 29, 2001

(65) Prior Publication Data

US 2003/0042606 A1 Mar. 6, 2003

(51) Int. Cl.
*H01L 21/28* (2006.01)

(52) U.S. Cl. .................. 438/627; 438/633; 438/643; 438/653; 438/655; 438/660; 438/663; 438/688

(58) Field of Classification Search ............... 438/627, 438/633, 643, 653, 655, 660, 663, 688, FOR. 355, 438/FOR. 350, 330
See application file for complete search history.

(56) References Cited

U.S. PATENT DOCUMENTS

| | | | |
|---|---|---|---|
| 4,793,896 A | 12/1988 | Douglas | 438/630 |
| 4,897,709 A | 1/1990 | Yokoyama et al. | 257/301 |
| 4,987,709 A * | 1/1991 | Bucci | 52/127.7 |
| 5,279,857 A * | 1/1994 | Eichman et al. | 427/255.11 |
| 5,608,232 A | 3/1997 | Yamazaki et al. | 257/66 |
| 5,700,716 A | 12/1997 | Sharan et al. | 437/190 |
| 5,747,116 A | 5/1998 | Sharan et al. | 427/534 |
| 5,851,680 A | 12/1998 | Heau | |
| 5,908,947 A | 6/1999 | Vaartstra | 556/42 |
| 5,946,594 A | 8/1999 | Iyer et al. | 438/648 |
| 5,976,976 A | 11/1999 | Doan et al. | 438/683 |
| 5,977,636 A | 11/1999 | Sharan | 257/763 |
| 5,990,021 A | 11/1999 | Prall et al. | 438/745 |
| 6,010,940 A | 1/2000 | Lee et al. | 438/396 |
| 6,037,252 A | 3/2000 | Hillman et al. | 438/637 |
| 6,054,191 A | 4/2000 | Sharan et al. | 427/534 |
| 6,086,442 A | 7/2000 | Sandhu et al. | 445/24 |
| 6,156,638 A | 12/2000 | Agarwal et al. | 438/627 |
| 6,184,135 B1 | 2/2001 | Ku | |
| 6,200,649 B1 | 3/2001 | Dearnaley | |
| 6,207,557 B1 * | 3/2001 | Lee et al. | 438/648 |
| 6,284,646 B1 * | 9/2001 | Leem | 438/629 |
| 6,329,670 B1 | 12/2001 | Hu | |

(Continued)

FOREIGN PATENT DOCUMENTS

JP 05267220 10/1993

(Continued)

*Primary Examiner*—George Fourson
(74) *Attorney, Agent, or Firm*—Whyte Hirschboeck Dudek SC

(57) ABSTRACT

Conductive contacts in a semiconductor structure, and methods for forming the conductive components are provided. The method comprises depositing a conductive material over a substrate to fill a contact opening, removing excess material from the substrate leaving the contact within the opening, and then heating treating the contact at a high temperature, preferably with a rapid thermal anneal process, in a reactive gas to remove an undesirable component from the contact, for example, thermal annealing a $TiCl_4$-based titanium nitride in ammonia to remove chlorine from the contact, which can be corrosive to an overlying aluminum interconnect at a high concentration. The contacts are useful for providing electrical connection to active components in integrated circuits such as memory devices. In an embodiment of the invention, the contacts comprise boron-doped and/or undoped $TiCl_4$-based titanium nitride having a low concentration of chlorine. Boron-doped contacts further possess an increased level of adhesion to the insulative layer to eliminate peeling from the sidewalls of the contact opening and cracking of the insulative layer when formed to a thickness of greater than about 200 angstroms in a high-aspect-ratio opening.

100 Claims, 6 Drawing Sheets

U.S. PATENT DOCUMENTS

| | | |
|---|---|---|
| 6,335,277 B1 * | 1/2002 | Ohto .................... 438/660 |
| 6,436,820 B1 * | 8/2002 | Hu et al. ................ 438/656 |
| 6,511,900 B1 | 1/2003 | Agarwal et al. |
| 2001/0002071 A1 | 5/2001 | Agarwal |
| 2001/0006240 A1 * | 7/2001 | Doan et al. .............. 257/296 |
| 2001/0025972 A1 * | 10/2001 | Moriwake et al. |
| 2001/0030235 A1 | 10/2001 | Hedemann et al. |
| 2001/0030552 A1 | 10/2001 | Hu |
| 2002/0001908 A1 | 1/2002 | Agarwal et al. |
| 2002/0155219 A1 * | 10/2002 | Wang et al. ........ 427/255.391 |
| 2003/0025206 A1 | 2/2003 | Derraa et al. |
| 2003/0042607 A1 | 3/2003 | Derraa et al. |
| 2003/0075802 A1 | 4/2003 | Derraa et al. |
| 2003/0077895 A1 | 4/2003 | Derraa et al. |

FOREIGN PATENT DOCUMENTS

| | | |
|---|---|---|
| JP | 05267220 A * | 10/1993 |
| JP | 09306870 | 4/1997 |
| JP | 10-172924 | 6/1998 |
| JP | 10-223563 | 8/1998 |

\* cited by examiner

METHOD OF FORMING A CONDUCTIVE CONTACT

FIELD OF THE INVENTION

The present invention relates to the field of semiconductor device fabrication, and more particularly to methods for making conductive contacts in the formation of a semiconductor device.

BACKGROUND OF THE INVENTION

As semiconductor fabrication moves toward maximizing circuit density, electrical components are formed at a number of layers and different locations. This requires electrical connection between metal layers or other conductive layers at different elevations in the substrate. Such interconnections are typically provided by forming a contact opening through insulating layer to the underlying conductive feature. With increasing circuit density, the dimensions of openings for electrical contacts become narrower and deeper, posing a challenge to provide adequate conductive fill within high aspect ratio openings.

Typically, in forming a contact plug, a thin layer of titanium is deposited over the top of a silicon base layer (substrate), and tungsten or other electrically conductive plug material is then deposited from tungsten hexafluoride ($WF_6$) by chemical vapor deposition (CVD) to fill the contact hole. However, there are several limitations of tungsten (W) plugs. Tungsten does not provide an adequate fill for high aspect ratio features. In addition, the use of $WF_6$ as a precursor gas in the formation of tungsten plugs, can result in the penetration of the fluoride component into the adjacent dielectric layer causing lateral encroachment and wormholes.

Titanium nitride (TiN) films have attractive properties that may overcome the limitations of tungsten plugs as integrated circuit (IC) devices continue to shrink below 0.15 micron dimension. TiN films have been deposited by low pressure chemical vapor deposition (LPCVD) using tetrakisdimethyl amidotitanium (TDMAT) and ammonia as precursor gases. However, TDMAT films have a high carbon content and when subjected to high temperatures in the presence of oxygen, become porous and, therefore, are unusable as a conductive contact.

Thin TiN films and liners have also been deposited from titanium tetrachloride ($TiCl_4$) and ammonia ($NH_3$) by CVD onto a titanium (Ti) liner overlying the insulative layer. Although useful for forming a thin liner, when pure $TiCl_4$-based TiN is deposited to fill a via or other contact opening, the material does not adhere well to the Ti thin layer, particularly when the TiN layer becomes greater than about 150 to about 200 angstroms thick.

In addition, it has been found that chlorine ($Cl_2$) within a contact fill material such as TiN, which has been deposited from a chlorine-containing precursor such as $TiCl_4$, can diffuse into and corrode an overlying interconnect (e.g., aluminum), thus ruining the device.

Another problem lies in the formation of a conductive contact (e.g., contact plug) in a contact hole or via. Typically, a conductive material is blanket deposited over the surface of the substrate including into the contact hole, thus forming a continuous film. If an anneal is needed, the continuous film layer is typically subjected to a high temperature anneal, and then excess material is removed from the surface of the substrate by a chemical mechanical polishing (CMP) process, leaving the contact plug within the hole. A problem arises, however, during the high temperature anneal with cracking of the blanket material layer.

Therefore, it would be desirable to provide a conductive contact and a method of forming the contact that avoids such problems.

SUMMARY OF THE INVENTION

The present invention provides methods for forming conductive contacts in the construction of semiconductive devices, and the conductive components formed by those methods. The method is useful for fabricating contacts to electrical components beneath an insulation layer in an integrated circuit such as memory devices.

The present $TiCl_4$-based titanium nitride films are particularly useful as conductive contacts to replace tungsten (W) plugs in high aspect ratio features, particularly openings and other features having an aspect ratio of 3:1 or greater. The films also overcome inadequacies of pure $TiCl_4$-based titanium nitride films that are used as fill material for forming conductive contacts or interconnects within contact openings formed through an insulative layer of a semiconductor structure. Pure $TiCl_4$-based titanium nitride fills do not adhere well to the surface of insulative sidewalls of a contact opening, and can also cause the insulative layer to crack due, at least in part, to the pressure exerted when the thickness of the fill within the contact opening is about 200 angstroms or greater.

The present invention overcomes the problems of a pure $TiCl_4$-based titanium nitride plugs or barrier film by incorporating diborane ($B_2H_6$) into the gas mixture to dope the $TiCl_4$-based titanium nitride film during the deposition process. The addition of $B_2H_6$ to the precursor gas used to form the $TiCl_4$-based titanium nitride film has been found to improve the mechanical properties of the resulting titanium nitride film with substantially no impact on its conductive properties. In particular, the gaseous mixture used to form the boron-doped, titanium nitride contacts comprises diborane ($B_2H_6$) in an amount effective to provide a contact having an amount of boron to provide a level of adhesion of the conductive contact to the insulative sidewalls of the contact opening to substantially eliminate peeling of the contact from the sidewalls and cracking of the body of the insulative layer. The mixture further includes an amount of ammonia ($NH_3$) to provide the contact with a level of nitrogen effective to maintain the conductivity of the contact at a predetermined level for an effective electrical contact with a conductive or active area within the substrate to/from an active area within a semiconductor device and/or a memory or logic array.

However, one drawback of titanium nitride films formed from $TiCl_4$, including the boron-doped films described herein, is that the chlorine ($Cl_2$) within the formed contact can diffuse into an overlying material, for example, an overlying interconnect of aluminum, and corrode and ruin the device. It has been found that a high temperature anneal of the $TiCl_4$-based titanium nitride film in a nitrogen-containing atmosphere, preferably ammonia ($NH_3$), removes excess $Cl_2$ from the contact material to overcome the diffusion problem. It has also been found that conducting a CMP process to remove excess material from the substrate prior to the anneal step avoids undesirable problems with cracking of the film layer and the wafer substrate.

In one aspect, the invention provides methods for forming a contact in a via or other contact opening of a semiconductor structure. The opening is formed through an insulative layer to a conductive or active area, such as a source/ drain region, in an underlying silicon substrate. The method is particularly useful for forming contacts within vias and other openings having an aspect ratio of about 3:1 or greater, and a width dimension of about 0.25 µm or less.

According to an embodiment of the method of the invention, a conductive material is blanket deposited over the substrate to fill the opening, and excess material is removed from the surface, preferably by chemical-mechanical polishing (CMP), with the conductive material remaining in the opening to form the contact. The contact is then heated to a high temperature, preferably by use of a rapid thermal anneal process, in a reactive gas to remove an undesirable component from the contact material.

In an example of this embodiment of the method, a titanium nitride contact can be formed by first depositing a seed layer comprising titanium silicide ($TiSi_x$) over the silicon substrate at the bottom of the contact opening, preferably to a thickness of about 250 to about 300 angstroms, for example, from a plasma source gas comprising titanium tetrachloride ($TiCl_4$) and hydrogen ($H_2$) by plasma-enhanced chemical vapor deposition (PECVD). A titanium nitride or boron-doped titanium nitride film (i.e., titanium boronitride, $TiB_xN_y$) can then be deposited onto the seed layer to fill the contact opening, typically to a thickness of about 1000 to about 3000 angstroms. The film layer can be deposited from a source gas mixture of $TiCl_4$, $NH_3$, and one or more carrier gases, with the addition of $B_2H_6$ to form the boron-doped layer, by thermal CVD at a pressure of about 1 to about 15 Torr and a temperature of about 550 to about 700° C. The substrate is then processed, preferably by CMP, to remove excess material from the substrate while leaving the titanium nitride material in the contact opening. The contact is then subjected to a high temperature in a nitrogen-containing gas, preferably ammonia ($NH_3$) at above 700° C. with a rapid thermal anneal, to remove a high percentage of the chlorine ($Cl_2$) content from the contact material, preferably up to about 99% by wt.

In another example of the method of the invention, a multi-layered titanium nitride contact is formed within a contact opening of a semiconductive structure. A titanium silicide seed layer is first formed over the silicon substrate at the bottom of the contact opening. To form the layered contact, alternating layers of titanium nitride and boron-doped titanium nitride can then be deposited over the seed layer. In forming the alternating layers, a layer comprising titanium nitride (undoped) can be deposited from a first gaseous mixture comprising $TiCl_4$ and $NH_3$, to form a layer typically about 100 to about 500 angstroms thick. Diborane ($B_2H_6$) can then be introduced into the gaseous mixture to deposit an intermediate layer of boron-doped titanium nitride to form a layer typically about 100 to about 500 angstroms thick. The flow of diborane into the gas mixture can then be stopped to deposit a next layer of titanium nitride layer that is not doped to a typical thickness of about 100 to about 500 angstroms. Additional alternating layers of doped and undoped titanium nitride can be deposited to fill the opening, with the uppermost layer being undoped titanium nitride. Excess material is then removed from the substrate by CMP, and the contact is subjected to a heat treatment, preferably by a rapid thermal anneal, preferably in ammonia at greater than 700° C., to decrease the chlorine ($Cl_2$) content of the contact.

Another aspect of the invention is a conductive contact formed in a semiconductor structure of a semiconductor circuit. The semiconductor structure comprises a silicon substrate, an overlying insulative layer, a contact opening formed through the insulative layer to expose the underlying silicon substrate, and the conductive contact formed within the opening.

In one embodiment of a contact according to the invention, the contact comprises a thermally annealed layer of titanium nitride and/or boron-doped titanium nitride overlying a titanium silicide layer formed over the substrate at the bottom of the opening, the contact having a low chlorine ($Cl_2$) content, preferably less than about 1% by wt.

In another embodiment, the conductive contact comprises multiple layers of thermally annealed titanium nitride overlying a titanium silicide layer deposited onto the silicon substrate at the bottom of the contact opening, the contact having a low chlorine ($Cl_2$) content, preferably less than about 1% by wt. The contact comprises alternating, overlying layers of undoped and boron-doped titanium nitride that fill the contact opening. An undoped titanium nitride layer overlies the titanium silicide layer, and also forms the uppermost layer of the conductive contact. The thickness of each of the individual layers is typically about 100 to about 500 angstroms.

Another aspect of the invention is an integrated circuit (IC) device that includes the foregoing conductive contacts comprising titanium nitride and/or boron-doped titanium nitride. The IC device comprises an array of memory or logic cells, internal circuitry, and at least one generally vertical conductive contact coupled to the cell array and internal circuitry.

In one embodiment of an integrated circuit device according to the invention, the IC device comprises a conductive contact comprising a thermally annealed titanium nitride and/or boron-doped titanium nitride fill that is formed within an insulative contact opening over a thin layer of titanium silicide deposited onto the exposed substrate at the bottom of a contact opening, and has a low chlorine ($Cl_2$) content, preferably less than about 1% by wt. In another embodiment of an integrated circuit device, the conductive contact comprises thermally annealed material having a reduced chlorine ($Cl_2$) content, preferably less than about 1% by wt., that is multi-layered, comprising alternating layers of titanium nitride (undoped) and boron-doped titanium nitride deposited onto a titanium silicide layer overlying the substrate at the bottom of a contact opening. The contact is in electrical contact with an active area such as a source/drain region of a transistor or a memory or logic cell array, or other semiconductor device.

Advantageously, the present film overcomes limitations of tungsten plug fills in high aspect ratio devices, with parametric data showing superior results compared to that of tungsten. The films also have a decreased level of undesirably components such as chlorine that become incorporated into the film upon deposition of precursor gases to form the film. The present method provides a process of removing undesirable components such as chlorine and the like, from a contact which overcomes problems in the art with cracking from anneal processing steps, and without adversely effecting other structures and devices formed on the substrate. The present invention provides processes for forming conductive contacts that are fast, simple and inexpensive to implement in semiconductor manufacturing.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate the same or like parts.

DETAILED DESCRIPTION OF THE PREFERRED EMBODIMENTS

Figure 1A:
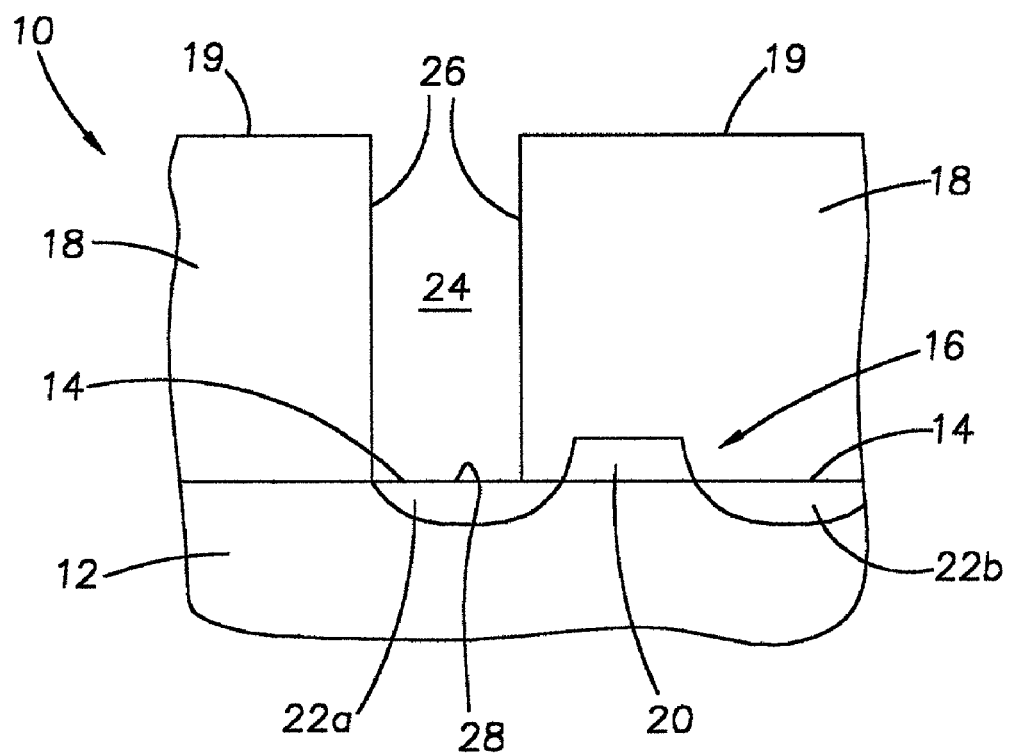
FIG. 1A is a diagrammatic cross-sectional view of a semiconductor wafer fragment at a preliminary step of a processing sequence.

The present invention encompasses methods of making integrated circuits, particularly methods for forming conductive contacts for providing electrical connection between conductive or active areas of discrete semiconductor devices or portions of such devices. In particular, the invention relates to methods of forming a conductive contact having a reduced concentration of unwanted constituents such as chlorine that become incorporated into the contact, for example, from precursors, during formation. The invention further relates to a contact structure incorporating a titanium nitride and/or a boron-doped titanium nitride film having a low chlorine content. The present invention is particularly useful in providing a conductive contact in openings and other features having a high aspect ratio of 3:1 or greater.

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

Integrated circuits include a large number of electronic semiconductor devices that are formed on varying levels of a semiconductor substrate. Exemplary semiconductor devices include capacitors, resistors, transistors, diodes, and the like. In manufacturing an integrated circuit, the discrete semiconductor devices that are located on nonadjacent structural levels are electrically connected, for example with an interconnect or conductive contact structure. The conductive contact generally comprises a region of conducting material that is formed between the semiconductor devices or portions of the semiconductor devices that are being placed in electrical communication. The conductive contact serves as a conduit for delivering electrical current between the semiconductor devices. Specific types of conductive contact structures include local interconnects, contacts, buried contacts, vias, plugs, and filled trenches. The present invention particularly deals with the method of making conductive contacts that are used in the fabrication of semiconductor devices.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. The term "undesirable component" refers to any element or compound contained within the contact material that will adversely affect a semiconductor device, for example, a high concentration of chlorine that can corrode an overlying aluminum interconnect and adversely affect the device.

A first embodiment of a method of the present invention is described with reference to FIGS. 1A–1D, in a method of forming a conductive contact 34. In the illustrated example, the contact 34 comprises titanium nitride or boron-doped titanium nitride. The contact is illustrated and will be described as being coupled to a diffusion region. However, the contacts of the present invention can be used wherever required within the structure of a semiconductor circuit.

Referring to FIG. 1A, a semiconductive wafer fragment 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as including a silicon-comprising base layer or substrate 12. An exemplary substrate 12 is monocrystalline silicon that is typically lightly doped with a conductivity enhancing material. Formed at the surface 14 of the substrate 12 are a transistor structure 16 and an overlying insulative layer 18. The transistor 16, comprising a gate 20 and adjacent source/drain diffusion regions 22a, 22b, can be formed by conventional methods known and used in the art.

The insulative layer 18 comprises an oxide, for example, silicon dioxide ($SiO_2$), phosphosilicate glass (PSG), borosilicate glass (BSG), and borophosphosilicate glass (BPSG), in a single layer or multiple layers, being BPSG in the illustrated embodiment. The BPSG insulative layer 18 has been etched using a known photolithography technique, for example, reactive ion etching (RIE), while masking with a patterned photoresist layer (not shown) to provide a via or other contact opening 24 defined by insulative sidewalls 26 and a bottom portion 28. The contact opening extends to the diffusion region 22a (i.e., source/drain region) in the underlying silicon substrate 12 to which electrical contact is to be made.

Figure 1B:
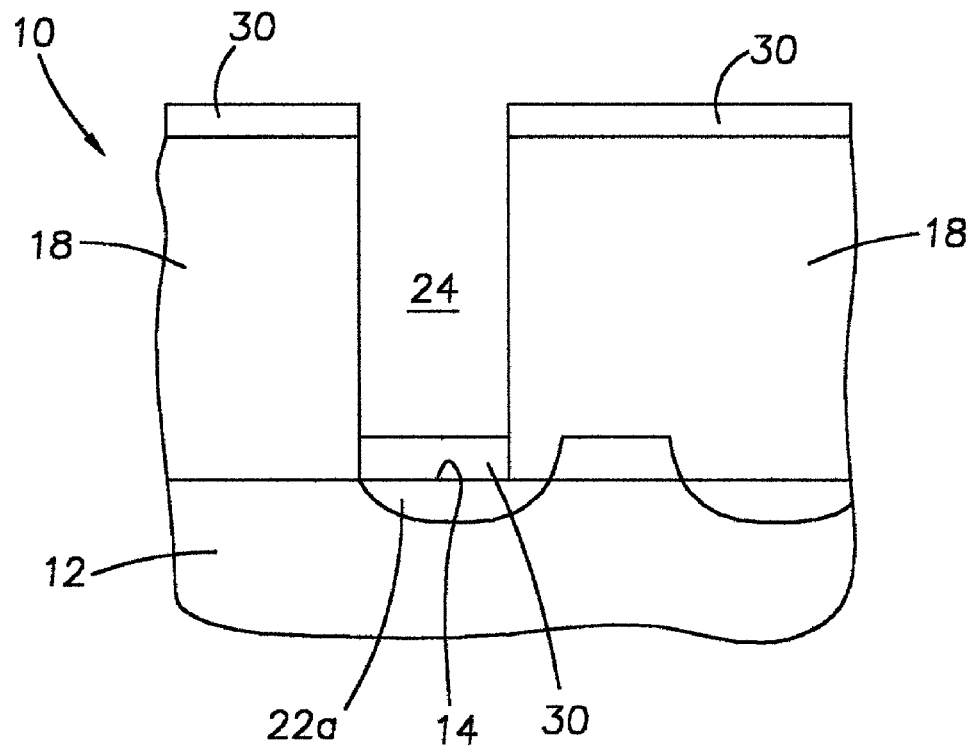
FIGS. 1B through 1D are views of the wafer fragment of FIG. 1A at subsequent and sequential processing steps, showing fabrication of a conductive contact according to an embodiment of the method of the invention.
Figure 1C:
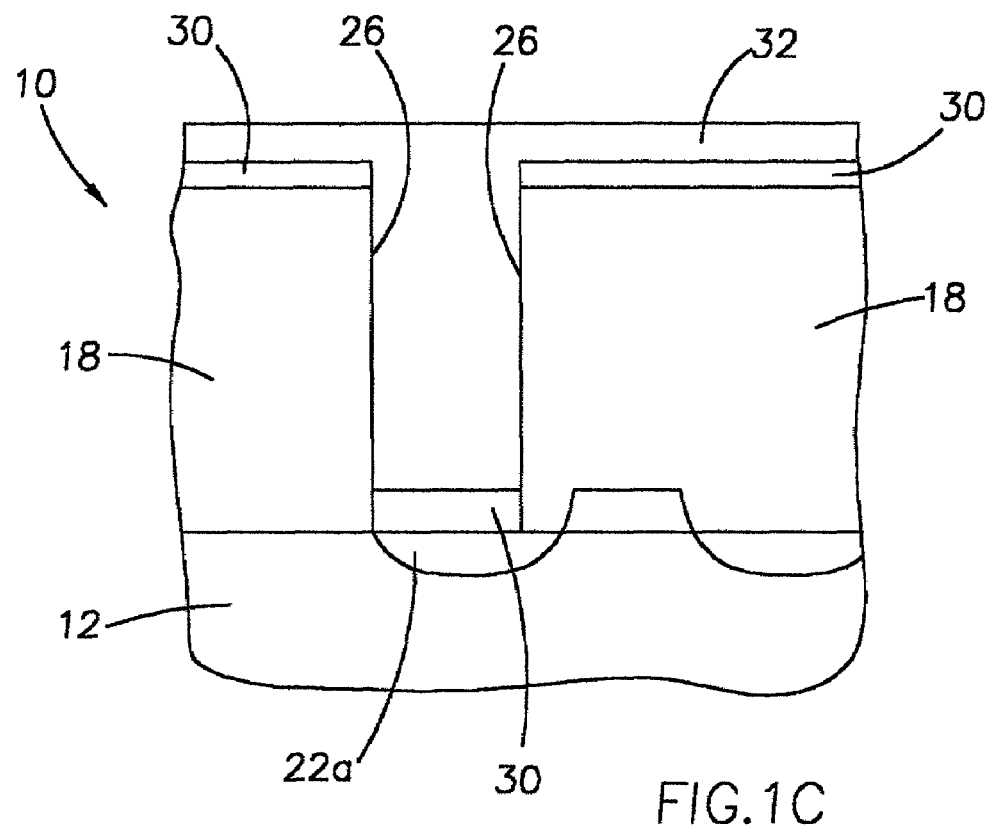

Referring to FIG. 1B, a titanium silicide ($TiSi_x$) seed layer 30 is formed over the exposed surfaces 14, 18 respectively, of the silicon substrate at the bottom 28 of the contact opening 24 and the insulative layer 18. Typically, the seed layer is formed to a thickness of about 250 to about 300 angstroms. The resulting $TiSi_x$ seed layer 30 that forms at the interface with the diffusion region 22a is useful to lower resistance in the contact region. Techniques and process systems for forming a titanium silicide layer are well known in the art, as described, for example, in U.S. Pat. No. 6,086,442 (Sandhu, et al.) and U.S. Pat. No. 5,976,976 (Doan, et al.), the disclosures of which are incorporated by reference herein.

Preferably, the $TiSi_x$ seed layer 30 is formed by a conventional plasma enhanced chemical vapor deposition (PECVD) process that comprises forming an RF plasma from source gases comprising titanium tetrachloride ($TiCl_4$), hydrogen ($H_2$), a silicon precursor such as silane ($SiH_4$) or dichlorosilane ($SiH_2Cl_2$), and carrier gases such as argon (Ar) and/or helium (He) to deposit a layer of titanium silicide ($TiSi_x$) over the substrate (silicon) surface 14 and the surface 19 of the insulative layer 18. Exemplary process conditions for achieving the formation of the $TiSi_x$ seed layer 30 include a temperature of about 650° C., a process pressure of about 0.5 to about 20 Torr, an rf power range of about 400 watts, and flow rates of about 150 to about 300 sccm $TiCl_4$, about 1000 to about 8000 sccm hydrogen ($H_2$), about 1 to about 100 sccm silane ($SiH_4$), about 1000 sccm argon (Ar), and about 50 sccm nitrogen ($N_2$).

Although the preferred process for forming the $TiSi_x$ seed layer is by PECVD technique, the $TiSi_x$ seed layer 30 can also be formed by a depositing a thin layer of titanium by physical vapor deposition (PVD), i.e., sputtering, onto the surface 14 of the substrate 12 at the bottom of the contact opening, and then performing an anneal step (about 650° C.) in an ambient gas such as nitrogen, argon, ammonia, or hydrogen. This causes the titanium to react with the silicon exposed on the surface 14 of the diffusion region 22a to form the $TiSi_x$ seed layer 30. Such a process is said to be self-aligning, as the $TiSi_x$ is only formed where the titanium metal contacts the silicon active regions.

Another example of a method to deposit the $TiSi_x$ seed layer 30 is by a conventional low pressure CVD (LPCVD) process. Exemplary process conditions include a process temperature of about 650° C. to about 900° C., and a pressure of about 10 mTorr to about 1 Torr, using titanium tetrachloride ($TiCl_4$) plus a silicon precursor or source gas such as silane ($SiH_4$) or dichlorosilane ($SiH_2Cl_2$) at a ratio of about 5:1, in a carrier gas such as helium.

To overcome the problems that occur in the use of a pure $TiCl_4$-based titanium nitride plug or contact, such as peeling of the contact from the insulative sidewalls of the contact opening and cracking of the insulative layer, the invention utilizes a boron-doped, $TiCl_4$-based titanium nitride fill (titanium boronitride) to form the conductive contact or plug. Preferably, the foregoing conductive contact is formed by a conventional thermal chemical vapor deposition (TCVD) process. Such TCVD techniques and process systems are well known in the art, as described, for example, in U.S. Pat. No. 6,037,252 (Hillman et al.), and U.S. Pat. No. 5,908,947 (Iyer and Sharan), the disclosures of which are incorporated by reference herein. TCVD systems include standard thermal reactors such as cold wall/hot substrate reactors and hot wall reactors, plasma-assisted reactors, radiation beam assisted reactors, and the like.

Typically, in a TCVD process, the substrate is placed in a reaction chamber (not shown) in which the substrate and/or the gaseous precursor is heated. Preferably, the substrate is heated to a temperature in excess of the decomposition temperature of the precursor gases. When the gases are introduced into the reaction chamber and brought into contact with the substrate, the gases decompose on the surface of the substrate to deposit the titanium boronitride film comprising the metal and elements of the precursor or reactant gases.

In an exemplary TCVD process to deposit a titanium nitride (TiN) or boron-doped TiN (TiBxNy) layer according to the invention using hot or cold wall thermal chemical vapor deposition, the wafer fragment 10 is positioned in the TCVD reactor (not shown) and a source gas comprising titanium tetrachloride ($TiCl_4$), ammonia ($NH_3$), one or more inert carrier gases such as argon, helium and/or nitrogen, and diborane ($B_2H_6$) to form a boron-doped TiN layer, is flowed into the reactor under conditions effective to chemical vapor deposit a layer 32 of $TiCl_4$-based titanium (doped or undoped) nitride over the titanium silicide ($TiSi_x$) seed layer 30 within the contact opening 24. The gaseous material is blanket deposited to a thickness to completely fill the contact opening, resulting in the structure shown in FIG. 1C. Preferred flow rates of the precursors are about 100 to about 500 sccm $TiCl_4$, about 100 to about 1000 sccm $NH_3$, and about 100 to about 1000 sccm $B_2H_6$ (for a boron-doped film). The preferred temperature within the reactor (hot wall) or of the susceptor (cold wall) is from about temperature of about 550 to about 700° C., preferably about 560 to about 650° C., with pressure conditions within the reactor being from about 1 Torr to about 15 Torr, preferably about 10 Torr. Typically, to fill a contact opening, about 1000 to about 3000 angstroms of material is typically deposited.

High-aspect-ratio contacts (aspect ratio of 3:1 or greater) that are made of $TiCl_4$-based TiN without the inclusion of $B_2H_6$ in the source gas, and have a thickness greater than about 150 to about 200 angstroms, possess a reduced level of adherence to the insulative sidewalls of a contact opening. This results in the contact peeling away from the sidewalls of the opening. In addition, when such contacts reach a thickness of about 200 angstroms or more, the high thermal stress of the fill material can cause cracking of the insulative layer. With the addition of increasing amounts of $B_2H_6$ to the $TiCl_4$ and $NH_3$ gaseous components, there is an increase in the adhesion of the fill material of the contact 34 with the insulative sidewalls 26 of the opening 24, and a reduction in the thermal stress level, which substantially eliminates cracking of the insulative layer 18. However, as the amount of boron increases, there is also a reduction in the level of conductivity (and increase in resistance) of the contact 34. To counteract this effect, the ammonia in the gas mixture is provided in an amount effective to maintain the conductivity of the formed contact 34 at a predetermined level for an effective electrical contact with the diffusion area 22a or other semiconductor structure.

The inclusion of $B_2H_6$ in the source gas results in a $TiCl_4$-based, boron doped titanium nitride conductive layer 32 having the general formula $TiB_xN_y$ (titanium boronitride). Such films are particularly useful as a fill in high-aspect-ratio contact openings and vias, particularly those having an aspect ratio of 3:1 or greater. The amounts of the $B_2H_6$ and the $NH_3$ gases that are flowed into the system are maintained so as to provide a fill having a level of adherence to the insulative sidewalls 26 of the contact opening 24 such that the formed contact 34 remains attached to and does not peel away from the sidewalls, and no substantial cracks develop in the body of the insulative layer 18.

Figure 1D:
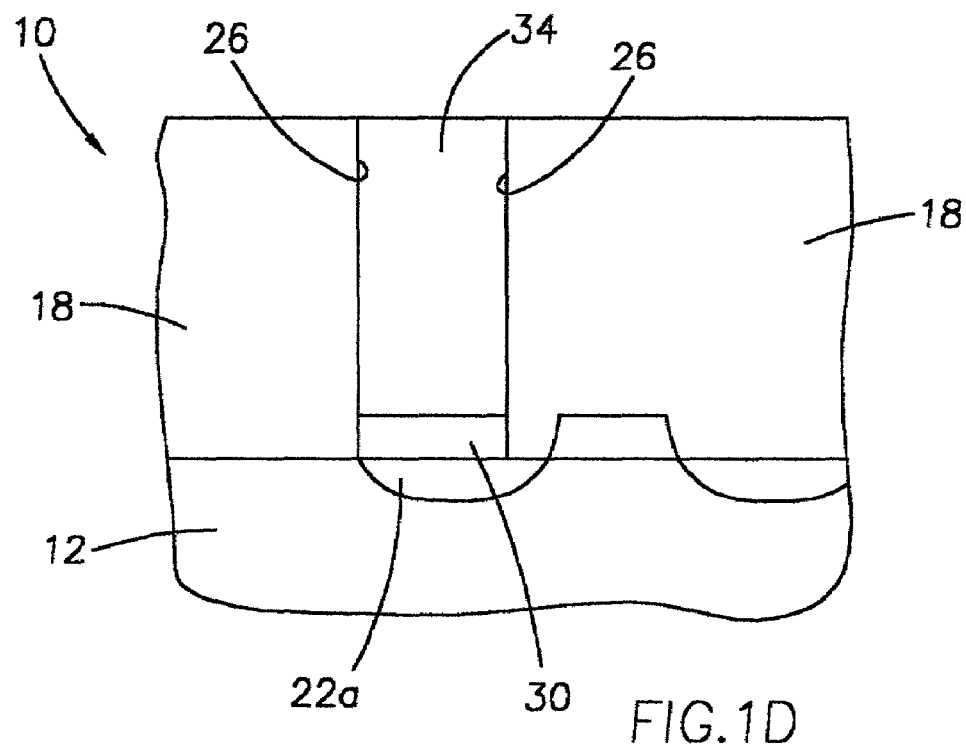

After deposition of the titanium nitride (doped or undoped) fill material, excess material 32 is removed from the surface 19 of the insulative layer, leaving the fill in the opening 24 to form the conductive contact or plug 34, as shown in FIG. 1D. The contact 34 provides electrical connection to/from the diffusion region (conductive area) 22a to various parts of the semiconductor device. The excess material 32 can then be removed according to a conventional method known in the art, preferably, by chemical mechanical polishing (CMP).

The contact 34 is then subjected to a heat treatment, preferably with a rapid thermal anneal process, to at least about 700° C., preferably about 700 to about 800° C., in a nitrogen-containing gas, preferably ammonia ($NH_3$), for a time of up to about 20 seconds, to drive out chlorine ($Cl_2$) incorporated into the contact from the $TiCL_4$ precursor during deposition. Preferably, the heat treatment reduces the concentration of chlorine in the contact by at least about 50% by wt., preferably by at least about 75% by wt., more preferably by at least about 95% by wt.

Advantageously, the present process of first removing the excess contact material by CMP, and then thermally annealing the titanium nitride fill material remaining as the contact 34 in a nitrogen-containing gas such as ammonia, reduces the chlorine content in the fill material without significantly changing the other properties of the film stack, particularly the advantages provided by the incorporation of boron into the film layer.

The resulting contact 34 comprises a titanium nitride layer (boron-doped or undoped) overlying a titanium silicide layer deposited onto the substrate at the bottom of the contact opening. The contact 34 possesses a reduced level of chlorine ($Cl_2$) as a result of the thermal anneal in ammonia ($NH_3$) or other nitrogen-containing gas. Preferably, the chlorine content of the contact following the anneal is less than about 4% by wt., preferably less than 3% by wt., more preferably less than about 1% by wt. Boron-doped titanium nitride contacts also possess a high level of adhesion to the insulative sidewalls of the opening, have a sufficiently low thermal stress level, measured in force per unit area (i.e., $Gdynes/cm^2$), to substantially eliminate cracking of the insulative layer, and are highly conductive with low electrical resistivity.

Although not shown, a passivation layer can then be formed over the device. Optionally, other interconnects and contact structures (not shown) can be formed overlying the present structure.

In another embodiment of the method of the invention, a multi-layered boron-doped and undoped titanium nitride contact can be fabricated in a wafer fragment, as depicted in FIGS. 2A–2F.

Figure 2A:
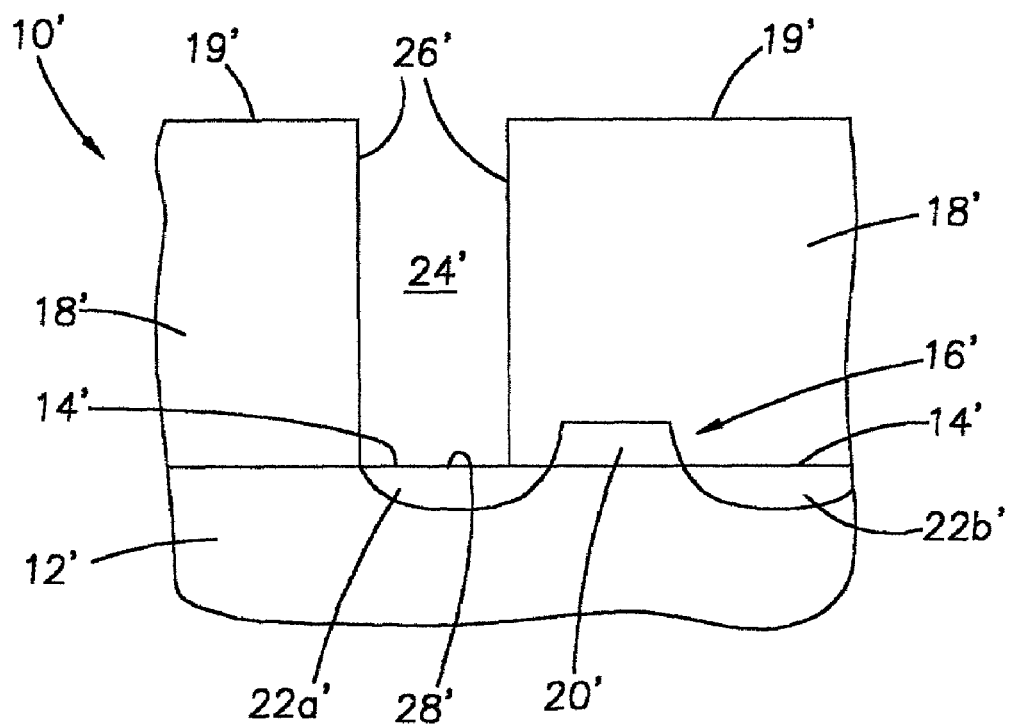
FIGS. 2A through 2F are views of the wafer fragment of FIG. 1A at subsequent and sequential processing steps, showing fabrication of a conductive contact according to another embodiment of the method of the invention.

Referring to FIG. 2A, a wafer fragment 10' is shown before processing. Briefly, wafer fragment 10' includes a silicon-comprising substrate 12', for example, monocrystalline silicon, with an active area 22a' such as a source/drain region. An overlying insulative layer 18' comprising, for example, BPSG, has an exposed surface 19' and a contact opening 24' having sidewalls 26' and a bottom portion 28'. The contact opening 24' extends to the active area 22a'.

Figure 2B:
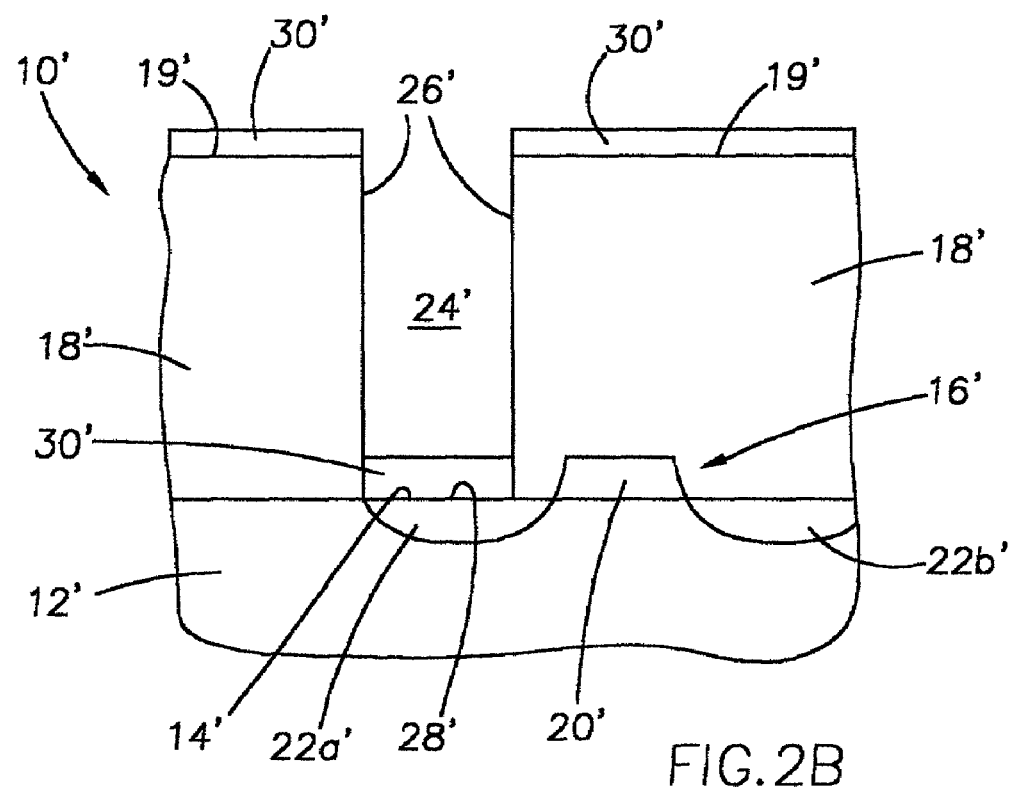

Referring to FIG. 2B, a thin titanium silicide ($TiSi_x$) layer 30' is formed over the active area 22a' at the bottom 28' of the opening 24'. The $TiSi_x$ layer 30' preferably has a thickness of about 250 to about 300 angstroms. The $TiSi_x$ layer 30' can be formed by conventional methods, as previously described, and preferably by PECVD using $TiCl_4$, $H_2$, and one or more carrier gases.

A layered contact is formed by depositing alternating layers of $TiCl_4$-based titanium nitride and a boron-doped $TiCl_4$-based titanium nitride into the contact opening, such that a boron-doped titanium nitride layer is interposed between two layers of non-doped titanium nitride. The multi-layered contact can be formed by conventional thermal CVD processing at a temperature of about 550 to about 700° C., preferably about 560 to about 650° C., and a pressure of about 1 Torr to about 15 Torr, preferably about 10 Torr.

Figure 2C:
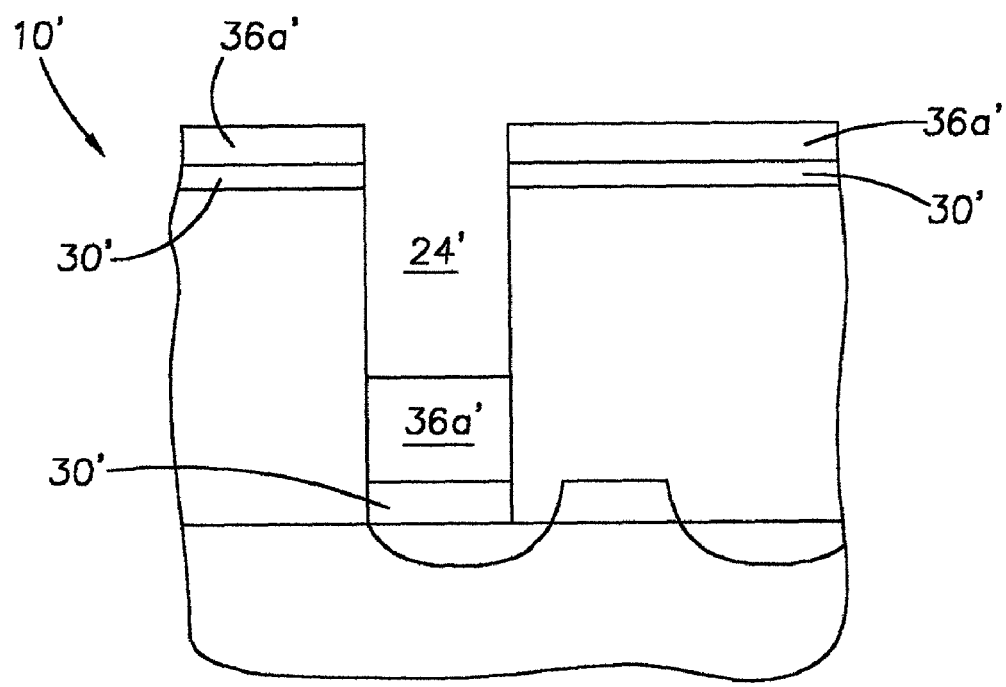

A gas mixture comprising titanium tetrachloride ($TiCl_4$) and ammonia ($NH_3$) and one or more carrier gases can be flowed into the reactor to form a layer 36a' of non-doped titanium nitride onto the $TiSi_x$ seed layer 30' to a desired thickness, typically about 100 to about 500 angstroms, resulting in the structure shown in FIG. 2C. Preferred flow rates for the gas mixture are about 100 to about 500 sccm $TiCl_4$ and about 100 to about 1000 sccm $NH_3$.

Figure 2D:
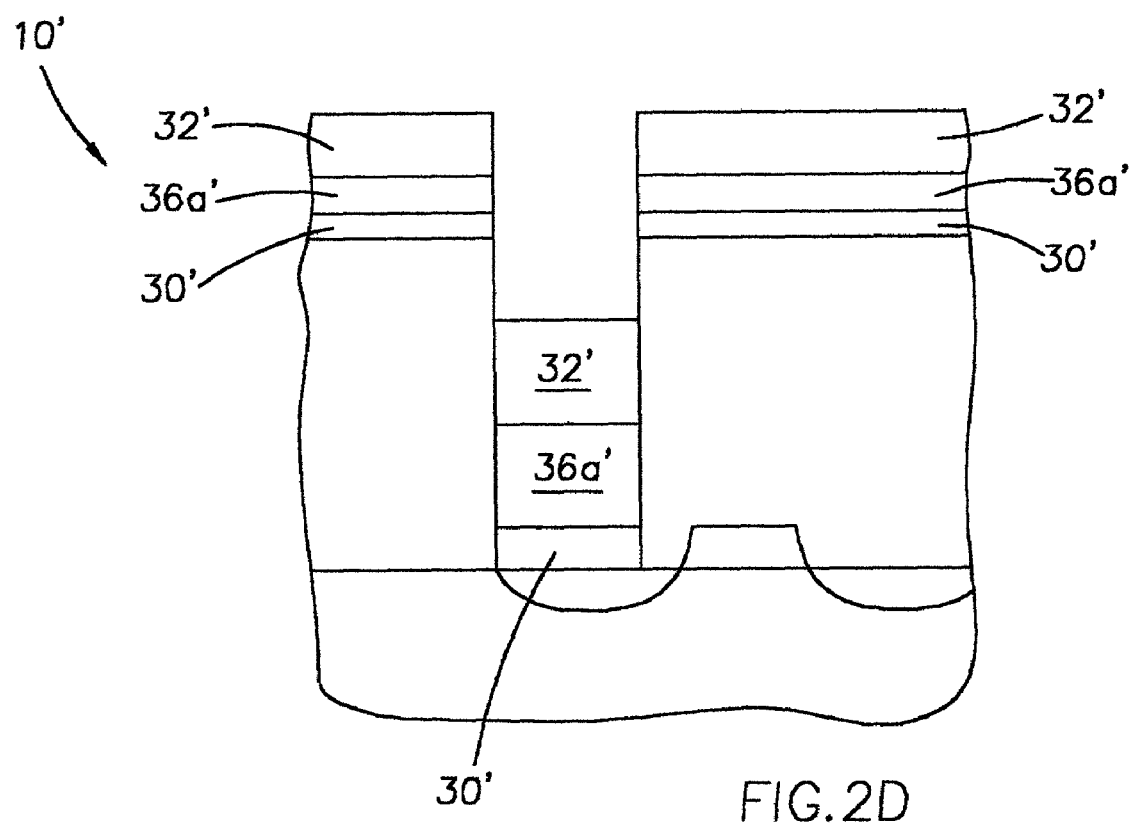

As shown in FIG. 2D, diborane ($B_2H_6$) is then flowed into the reactor, and a layer 32' comprising boron-doped, titanium nitride is deposited onto the non-doped titanium nitride layer from a gas mixture comprising $TiCl_4$, $NH_3$, and $B_2H_6$. The boron-doped, titanium nitride layer 32' is deposited to a desired thickness of about 100 to about 500 angstroms. Preferred flow rates for the gas mixture are about 100 to about 500 sccm $TiCl_4$, about 100 to about 1000 sccm $NH_3$, and about 100 to about 1000 sccm $B_2H_6$. As previously discussed, the flow of $NH_3$ and $B_2H_6$ can be controlled to modify the adhesiveness, thermal stress level, and conductivity of the resulting multi-layered contact.

Figure 2E:
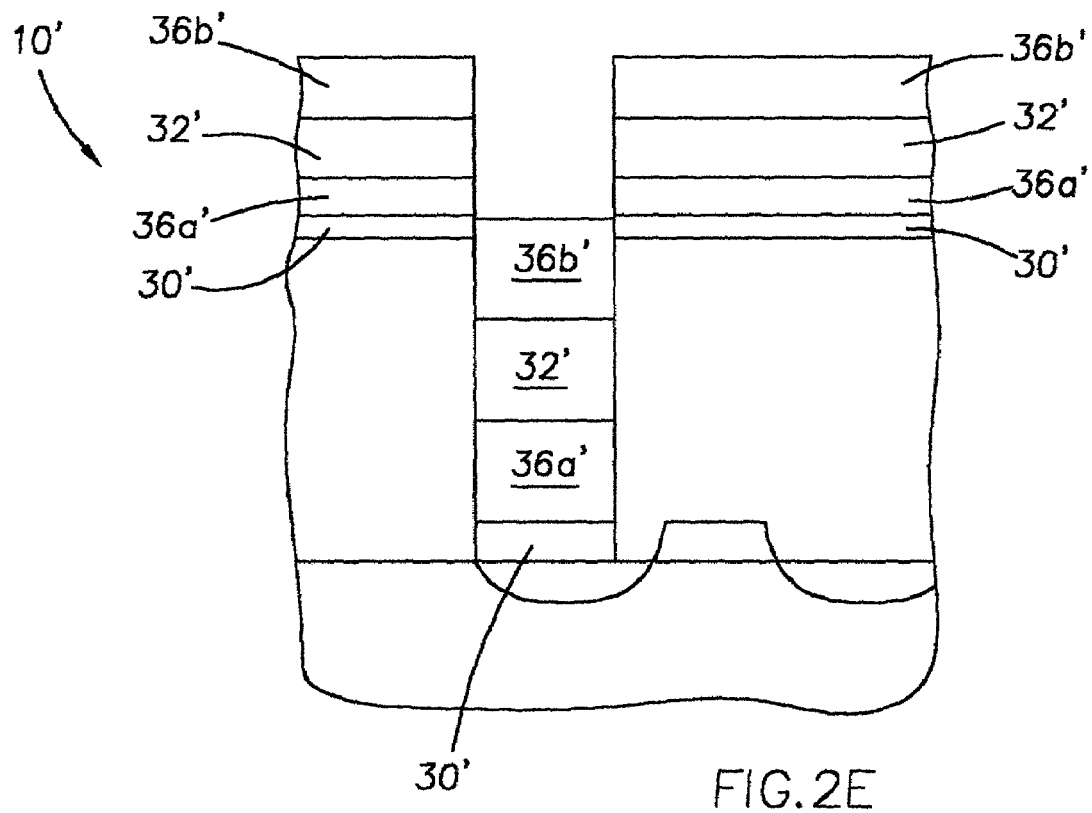

The flow of $B_2H_6$ is then ceased, and the first source gas mixture (i.e., $TiCl_4$, $NH_3$) is flowed into the reactor to form a layer 36b' comprising undoped titanium nitride, as shown in FIG. 2E. The titanium nitride layer 36b' is deposited to a desired thickness, typically about 100 to about 500 angstroms. The titanium nitride layer 36b' can be deposited to fill the opening. Alternatively, additional layers of boron-doped titanium nitride can be deposited between two layers of non-doped titanium nitride as desired to fill the contact opening 24', with the uppermost layer of the contact comprising non-doped titanium nitride.

Figure 2F:
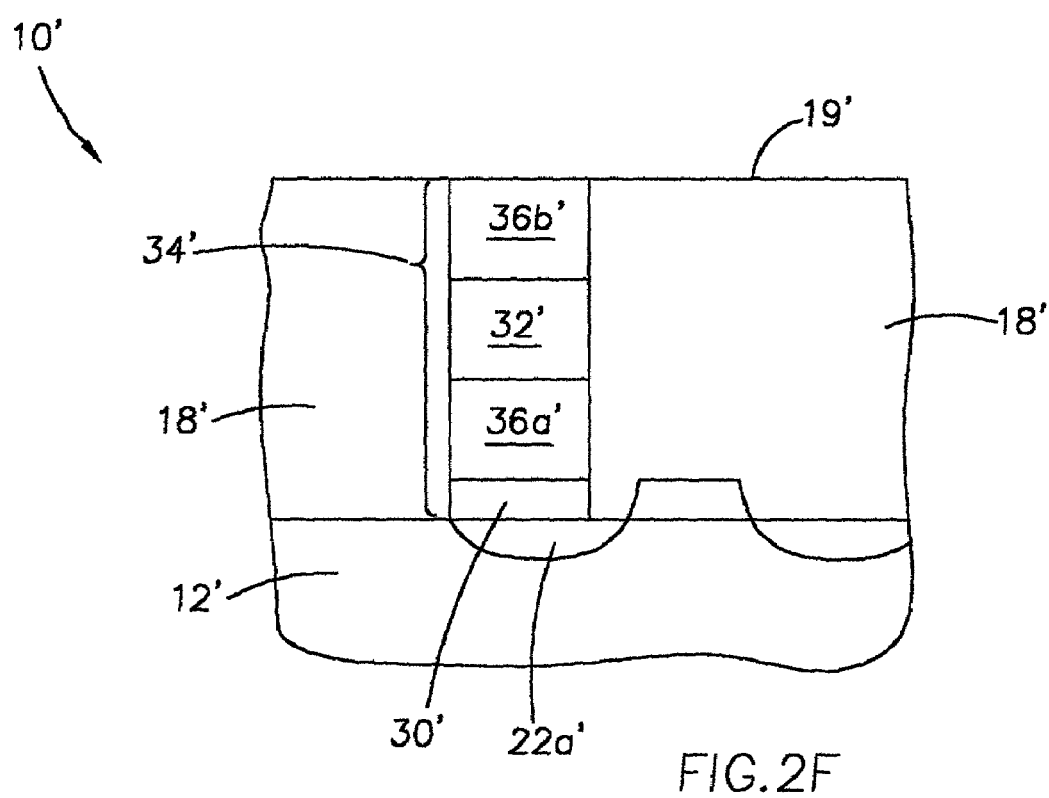

Excess fill material is then removed as depicted in FIG. 2F, for example, by CMP, to form the conductive contact 34'.

The contact 34' is then subjected to a thermal anneal at an elevated temperature, preferably greater than 700° C., preferably about 700° C. to about 800° C., in a nitrogen-containing atmosphere, preferably ammonia ($NH_3$), to drive the chlorine ($Cl_2$) deposited from the $TiCl_4$ precursor out of the contact material.

Sandwiching a layer of boron-doped titanium nitride 32' between undoped titanium nitride substantially reduces the thermal stress in a $TiCl_4$-based TiN fill material. This allows the fill to be used as a conductive contact to replace tungsten (W) plugs in high aspect ratio features. The combination of alternating layers achieves a $TiCl_4$-based TiN contact having a level of adhesion that substantially eliminates peeling of the formed contact from the sidewalls of the contact opening. It also provides a lowered level of thermal stress that substantially reduces cracking of the body of the insulative layer, particularly when the thickness of the contact reaches about 500 angstroms or greater. In addition, the resulting contact has a high level of conductivity for an effective electrical contact to a diffusion region or other conductive structure. The removal or reduction of chlorine (or other component) from the contact material by a high temperature anneal in ammonia (or other reactive gas) provides a contact having increased compatibility with an adjacent or overlying conductive material, for example, an aluminum interconnect. In addition, conducting the thermal anneal step after removing excess conductive material from the surface of the substrate eliminates problems encountered with cracking of the film layer and/or the substrate with thermal anneals performed on a blanket material layer overlying the substrate.

EXAMPLE 1

A boron-doped $TiCl_4$-based titanium nitride (TiN) contact was formed in a high aspect ratio opening of a BPSG layer, without removal of chlorine by RTP anneal. The flow of diborane ($B_2H_6$) was varied over a range to test the change in thermal stress ($Gdynes/cm^2$) of the boron-doped, $TiCl_4$-based TiN contact on the BPSG insulative layer.

A wafer fragment was provided that had a silicon substrate layer and an overlying layer of BPSG. A contact opening was formed through the BPSG layer. The aspect ratio of the opening was 10:1.

The $TiCl_4$-based TiN film was deposited by thermal CVD at a pressure of 10 Torr using a Centura system, available from Applied Materials company of Santa Clara, Calif. The precursor gases were flowed into the reactor as follows: 340 sccm $TiCl_4$, 200 sccm $NH_3$, 3000 sccm argon (Ar), and 2000 sccm gaseous nitrogen ($N_2$). The diborane ($B_2H_6$) was flowed into the reactor at a rate ranging from 200 sccm to 600 sccm. Data was measured at two different temperatures: 600° C. and 650° C.

Figure 3A:
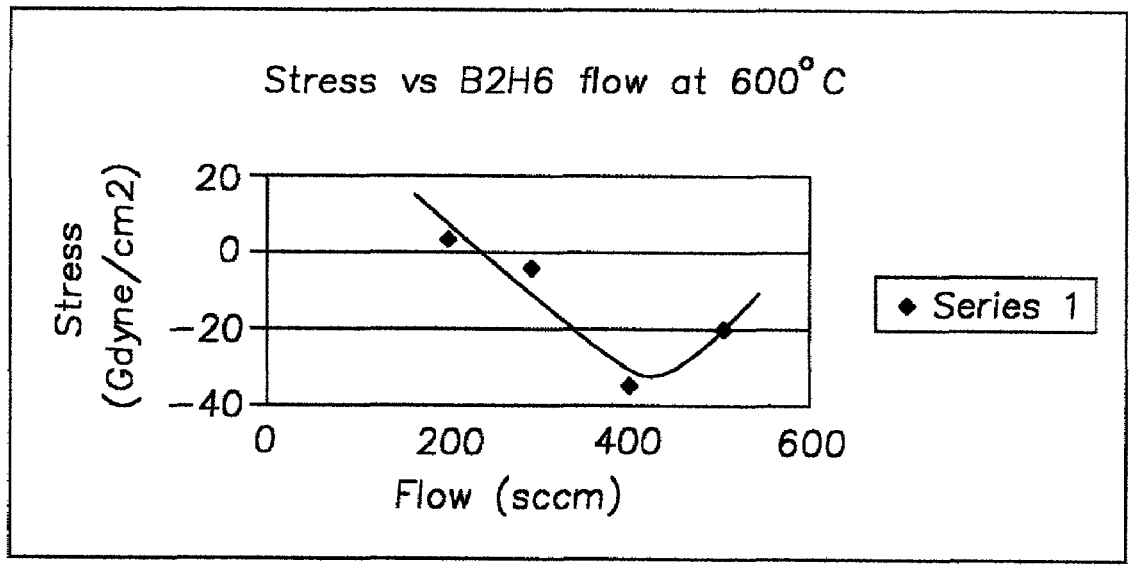
FIGS. 3A and 3B are graphical depictions showing the amount of thermal stress (Gdynes/cm$^2$) versus diborane ($B_2H_6$) flow over a range of 200 to 600 sccm at reactor temperatures of 600° C. and 650° C.
Figure 3B:
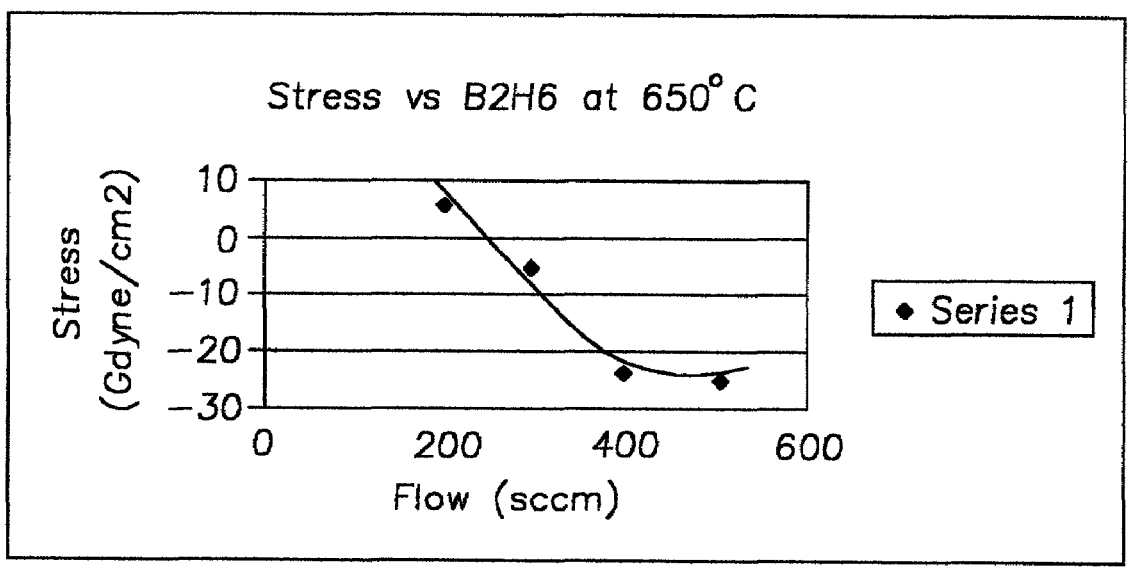

The results are shown in a graphical form in FIGS. 3A and 3B. As indicated, as the amount of boron (i.e., $B_2H_6$) was increased, the stress (Gdynes/cm$^2$) of the $TiCl_4$-based TiN material decreased to a neutral or zero stress level and below. Thus, by varying the $B_2H_6$ flow, the thermal stress of the $TiCl_4$-based TiN film can be adjusted such that the material does not cause the insulative layer (e.g., BPSG) to crack.

EXAMPLE 2

A boron-doped $TiCl_4$-based titanium nitride (TiN) contact was formed in a high aspect ratio opening of a BPSG layer according to the method of the invention. A boron-doped TiN film was formed in a contact opening (10:1 aspect ratio) in a BPSG layer overlying a silicon substrate, as described in Example 1.

Excess titanium nitride film material was removed from the surface of the BPSG layer by conventional CMP, leaving the film material within the contact opening. The wafer was then subjected to a high temperature anneal by rapid thermal processing (RTP) in an ammonia ($NH_3$) atmosphere at 750° C. for 25 seconds. PEELS micrographs showed differences in the chlorine ($Cl_2$) content of the boron-doped titanium nitride material before and after the high temperature anneal.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact, comprising the steps of:
   depositing a source gas onto a substrate to form a fill having a thickness of about 500 angstroms or greater within an opening in the substrate, the source gas comprising a component capable of diffusing into and corroding an adjacent metal layer;
   removing excess material from the substrate to form the conductive contact within the opening the contact having a thickness of about 500 angstroms or greater; and
   heating the conductive contact in a reactive gas at a temperature of about 700° C. or greater to reduce the component throughout the thickness of the conductive contact without forming substantial cracks within the conductive contact.

2. The method of claim 1, wherein the step of heating the contact comprises a rapid thermal anneal process.

3. The method of claim 1, wherein the step of removing the excess material comprises chemical mechanical polishing.

4. The method of claim 1, wherein the component comprises chlorine.

5. The method of claim 1, wherein the source gas comprises a chlorine-containing precursor, and the component comprises chlorine.

6. The method of claim 5, wherein the chlorine-containing precursor comprises $TiCl_4$.

7. The method of claim 5, wherein the reactive gas comprises a nitrogen-containing gas.

8. The method of claim 7, wherein the reactive gas comprises ammonia.

9. The method of claim 5, wherein the contact comprises titanium nitride, the chlorine-containing precursor comprises titanium, and the source gas further comprises ammonia.

10. The method of claim 9, wherein the contact comprises boron-doped titanium nitride, and the source gas further comprises borane.

11. A method of forming a conductive contact, comprising the steps of:
    depositing a source gas comprising a chlorine-containing precursor onto a substrate to form a fill having a thickness of about 500 angstroms or greater within an opening in the substrate;
    removing excess material from the substrate to form the conductive contact in the opening, the conductive contact having a thickness of about 500 angstroms or greater; and
    heating the conductive contact in a nitrogen-containing gas at a temperature of about 700° C. or greater to decrease chlorine throughout the thickness of the conductive contact by at least about 50% by wt. without forming substantial cracks within the conductive contact.

12. The method of claim 11, wherein the step of heating the contact comprises a rapid thermal anneal process.

13. The method of claim 11, wherein the step of removing the excess material comprises chemical mechanical polishing.

14. The method of claim 11, wherein the chlorine-containing precursor comprises titanium, the source gas further comprises ammonia, and the contact comprises titanium nitride.

15. The method of claim 14, wherein the source gas further comprises borane, and the contact comprises boron-doped titanium nitride.

16. A method of forming a conductive contact, comprising the steps of:
    depositing a source gas comprising a titanium and chlorine-containing precursor onto a substrate to form a conductive contact within an opening in the substrate, the conductive contact having a thickness of at least about 500 angstroms;
    removing excess material from the substrate such that the conductive contact has a thickness of about 500 angstroms or greater; and
    heating the conductive contact in a nitrogen-containing gas at a temperature of about 700° C. or greater to decrease chlorine through out the thickness of the conductive contact without forming substantial cracks within the conductive contact.

17. The method of claim 16, wherein the step of heating the contact comprises a rapid thermal anneal process.

18. The method of claim 16, wherein the source gas further comprises an ammonia precursor to form titanium nitride.

19. The method of claim 16, wherein the titanium and chlorine-containing precursor comprises $TiCl_4$.

20. The method of claim 18, wherein the source gas further comprises a borane precursor to form boron-doped titanium nitride.

21. The method of claim 16, wherein the nitrogen-containing gas comprises ammonia.

22. A method of forming a conductive contact, comprising the steps of:
depositing a source gas onto a substrate to form a fill having a thickness of about 500 angstroms or greater within a contact hole in the substrate; the source gas comprising $TiCl_4$;
removing excess material from the substrate to form the conductive contact in the contact hole, the conductive contact having a thickness of about 500 angstroms or greater; and
thermally annealing the conductive contact in a nitrogen-containing gas at a temperature of about 700° C. or greater to decrease chlorine through the thickness of the conductive contact without forming substantial cracks within the conductive contact; the nitrogen-containing gas comprising ammonia.

23. The method of claim 22, wherein the step of thermally annealing the contact comprises rapid thermal anneal at about 700° C. to about 800°C.

24. The method of claim 22, wherein the source gas further comprises an ammonia precursor to form titanium nitride.

25. The method of claim 24, wherein the source gas further comprises a borane precursor to form boron-doped titanium nitride.

26. A method of forming a conductive contact, comprising the steps of:
forming a titanium silicide layer over a substrate and within a contact hole;
depositing a titanium nitride layer onto the titanium silicide layer to form a fill within the contact hole by combining a titanium and chlorine-containing precursor with a nitrogen-containing precursor to form a titanium nitride fill having a thickness of about 500 angstroms or greater;
removing excess material from the substrate to form the conductive contact in the contact hole, the conductive contact having a thickness of at least about 500 angstroms and comprising an amount of chlorine; and
thermally annealing the conductive contact in a nitrogen-containing gas at a temperature of about 700° C. or greater to decrease the amount of chlorine throughout the thickness without forming substantial cracks within the conductive contact.

27. The method of claim 26, wherein the step of thermally annealing the contact comprises a rapid thermal anneal at a temperature of 700° C. to about 800° C.

28. The method of claim 26, wherein the step of depositing the titanium nitride layer comprises combining $TiCl_4$ and $NH_3$ in a thermal chemical vapor deposition.

29. The method of claim 26, wherein the step of depositing the titanium nitride layer further comprises combining the precursors with a $B_2H_6$ precursor to form boron-doped titanium nitride.

30. A method of forming a conductive contact, comprising the steps of:
forming a titanium silicide layer over a substrate and within an opening in the substrate;
depositing a boron-doped titanium nitride material onto the titanium silicide layer to fill the opening by combining a titanium and chlorine-containing precursor with a nitrogen-containing precursor and a borane precursor to form a boron-doped titanium nitride fill having a thickness of about 500 angstroms or greater and comprising an amount of chlorine;
removing excess material from the substrate to form the conductive contact in the opening, the conductive contact having a thickness of at least about 500 angstroms; and thermally annealing the conductive contact in a nitrogen-containing gas at a temperature of about 700° C. or greater to decrease the amount of chlorine throughout the thickness of the conductive contact without forming substantial cracks within the conductive contact.

31. The method of claim 30, wherein the step of thermally annealing the contact comprises a rapid thermal anneal at a temperature of 700° C. to about 800° C.

32. The method of claim 30, wherein the step of depositing the boron-doped titanium nitride layer comprises combining $TiCl_4$, $NH_3$, and $B_2H_6$ in a thermal chemical vapor deposition.

33. A method of forming a conductive contact within an opening through an insulative layer, the opening having sidewalls and extending to an underlying silicon-comprising substrate, the method comprising the steps of:
forming a titanium silicide layer over the insulative layer within the opening;
depositing a source gas over the titanium silicide layer to form a fill comprising titanium nitride having a thickness of about 500 angstroms or greater within the opening; the source gas comprising a chlorine-containing precursor;
removing excess of the titanium nitride layer to form the conductive contact within the opening; the contact having a concentration of chlorine and a thickness of at least about 500 angstroms; and
subjecting the conductive contact to a heat treatment in a nitrogen-containing gas at a temperature of about 700° C. or greater to reduce the concentration of chlorine throughout the thickness of the conductive contact without forming substantial cracks within the conductive contact.

34. The method of claim 33, wherein the step of subjecting the contact to the heat treatment comprises a rapid thermal anneal.

35. The method of claim 33, wherein the contact is subjected to the heat treatment at a temperature of at least about 700° C. to about 800° C.

36. The method of claim 33, wherein the step of forming the titanium silicide layer comprises a plasma enhanced chemical vapor deposition of a titanium precursor with a silicon precursor to form titanium silicide.

37. The method of claim 33, wherein the step of depositing the source gas to form the titanium nitride layer comprises a thermal chemical vapor deposition.

38. The method of claim 33, wherein the source gas comprises a titanium and chlorine-containing precursor and a nitrogen-containing precursor to form titanium nitride.

39. The method of claim 38, wherein the source gas further comprises a borane precursor to form a boron-doped titanium nitride contact.

40. The method of claim 33, wherein the step of subjecting the contact to a heat treatment reduces the chlorine concentration of the contact by at least about 75% by wt.

41. The method of claim 33, wherein the step of subjecting the contact to a heat treatment reduces the chlorine concentration of the contact by at least about 95% by wt.

42. The method of claim 33, wherein the chlorine concentration of the heat treated conductive contact is less than about 1% by wt.

43. The method of claim 33, wherein the chlorine concentration of the heat treated conductive contact is less than about 3% by wt.

44. The method of claim 33, wherein the chlorine concentration of the heat treated conductive contact is less than about 4% by wt.

45. A method of forming a conductive contact, comprising:
depositing a first source gas comprising $TiCl_4$, $H_2$, and $SiH_4$ precursors onto a substrate to form a titanium silicide layer in an opening;
depositing a second source gas comprising $TiCl_4$ and $NH_3$ precursors onto the titanium silicide layer to form a titanium nitride layer having a thickness of about 500 angstroms or greater within the opening;
removing excess of the titanium nitride layer by chemical mechanical polishing while maintaining the titanium nitride layer within the opening to form the conductive contact; the conductive contact having a concentration of chlorine and a thickness of at least about 500 angstroms; and
exposing the conductive contact to a nitrogen-containing gas by thermal anneal at a temperature of about 700° C. or greater to reduce the concentration of chlorine throughout the thickness of the conductive contact without forming substantial cracks within the conductive contact.

46. The method of claim 45, wherein the nitrogen-containing gas comprises ammonia.

47. The method of claim 45, wherein the thermal anneal is conducted at a temperature of at least about 700° C. to about 800° C.

48. The method of claim 45, wherein the chlorine concentration of the thermally annealed contact is less than about 3% by wt.

49. A method of forming a conductive contact, comprising:
depositing a first source gas comprising $TiCl_4$, $H_2$, and $SiN_4$ precursors onto a substrate to form a titanium silicide layer in an opening;
depositing a second source gas comprising $TiCl_4$, $NH_3$, and $B_2H_6$ precursors onto the titanium silicide layer to form a boron-doped titanium nitride layer having a thickness of about 500 angstroms or greater within the opening;
removing excess of the boron-doped titanium nitride layer by chemical mechanical polishing while maintaining the boron-doped titanium nitride layer within the opening to form the conductive contact; the conductive contact having a concentration of chlorine and a thickness of about 500 angstroms or greater; and
exposing the conductive contact to a nitrogen-containing gas by thermal anneal at a temperature of about 700° C. or greater to reduce the concentration of chlorine throughout the thickness of the conductive contact without forming substantial cracks within the contact.

50. The method of claim 49, wherein the chlorine concentration of the thermally annealed conductive contact is less than about 3% by wt.

51. A method of forming a conductive contact in an opening through an insulative layer, the opening having sidewalls and extending to an underlying silicon-comprising substrate, the method comprising the steps of:
forming a layer comprising titanium silicide over the insulative layer and the substrate within the opening;
depositing a layer of boron-doped titanium nitride over the titanium silicide layer from a titanium and chlorine-containing precursor to fill the opening, the boron-doped titanium nitride fill layer having a thickness of about 500 angstroms to greater;
removing excess of the boron-doped titanium nitride fill layer overlying the insulative layer while leaving a portion of the boron-doped titanium nitride layer within the opening to farm the conductive contact having a thickness of at least about 500 angstroms; and
heat treating the conductive contact at a temperature of about 700° C. or greater to remove chlorine throughout the thickness of the conductive contact without forming substantial cracks therein.

52. The method of claim 51, wherein the opening has an aspect ratio of about 3:1 or greater.

53. The method of claim 51, wherein the opening is about 0.25 µm or less.

54. The method of claim 51, wherein the conductive contact has a thickness of about 1000 to about 3000 angstroms.

55. The method of claim 51, wherein the step of depositing the boron-doped titanium nitride layer is by thermal chemical vapor deposition using a gaseous mixture comprising titanium tetrachloride, ammonia, and diborane.

56. The method of claim 57, wherein the step of depositing the boron-doped titanium nitride layer is performed by flowing about 100 to about 500 sccm titanium tetrachloride, about 100 to about 1000 sccm ammonia, and about 100 to about 1000 sccm diborane over the substrate.

57. The method of claim 51, wherein the titanium nitride layer comprises an amount of boron to substantially eliminate peeling of the conductive contact from the sidewall of the opening and cracking of the insulative layer, and an amount of nitrogen to provide an effective amount of conductivity to an active area within the substrate.

58. The method of claim 57, wherein the active area comprises a source or drain region.

59. The method of claim 51, wherein the step of depositing the boron-doped titanium nitride layer comprises:
depositing a layer of titanium nitride over the titanium silicide layer;
depositing a layer of boron-doped titanium nitride over the titanium nitride layer; and
depositing a layer of titanium nitride over the boron-doped titanium nitride layer; and
repeating the foregoing steps to form the boron-doped titanium nitride layer having a thickness of about 500 angstroms or greater as a multi-layered fill within the opening.

60. The method of claim 51, wherein the step of depositing the boron-doped titanium nitride layer comprises depositing a layer of titanium nitride over the titanium silicide layer, and sequentially depositing overlying layers of boron-doped titanium nitride and titanium nitride to form a multi-layered film within the opening having a thickness of about 500 angstroms or greater; the fill comprising a boron-doped titanium nitride layer interposed between two titanium nitride layers.

61. The method of claim 60, wherein each of the layers of the multi-layered film are about 100 to about 500 angstroms thick.

62. The method of claim 51, wherein the step of depositing the titanium silicide layer is by plasma enhanced chemical vapor deposition using a source gas comprising titanium tetrachloride and a silicon precursor.

63. The method of claim 51, wherein the step of depositing the titanium silicide layer comprises the steps of sputtering titanium onto the substrate, and annealing the titanium.

64. A method of forming a conductive contact in an opening of a semiconductor substrate, the opening formed in an insulative layer and extending to an underlying silicon-comprising substrate, the opening defined by sidewalls and a bottom portion; the method comprising the steps of:
    forming a layer comprising titanium silicide aver the substrate and within the opening; and
    depositing a boron-doped titanium nitride material over the titanium silicide layer and into the opening to form a fill having a thickness of about 500 angstroms or greater;
    removing excess material from the substrate while leaving the boron-doped titanium nitride fill in the opening to form the contact, wherein the contact has a thickness of about 500 angstroms or greater; and
    heating the contact in a nitrogen-containing gas at a temperature of about 700° C. or greater to reduce the concentration of chlorine throughout the thickness of the contact to less than about 3% by wt. without farming substantial cracks within the contact;
    wherein the conductive contact comprises an amount of boron to substantially eliminate peeling of the contact from the sidewall of the opening and cracking of the insulative layer, and an amount of nitrogen to provide an effective amount of conductivity to an active area within the substrate.

65. A method of forming a conductive contact in a semiconductor device comprising an opening through an insulative layer, the opening having sidewalls and extending to an underlying silicon-comprising substrate, the method comprising the steps of:
    depositing a layer comprising titanium silicide over the insulative layer and the substrate within the opening; and
    forming a titanium nitride layer over the titanium silicide by depositing a layer of titanium nitride aver the titanium silicide layer; and sequentially depositing overlying layers of boron-doped titanium nitride and titanium nitride to fill the opening, wherein the boron-doped titanium nitride layer is interposed between two titanium nitride layers and the fill has a thickness of about 500 angstroms or greater;
    removing excess fill overlying the insulative layer while leaving the fill within the opening to form the contact; the contact having a concentration of chlorine and a thickness of about 500 angstroms or greater; and
    heating the contact in a nitrogen-containing gas at a temperature of about 700° C. or greater to reduce the concentration of chlorine to less than about 3% by wt. without forming substantial cracks within the contact;
    wherein the contact comprises an amount of boron to substantially eliminate peeling of the contact from the sidewall of the opening and cracking of the insulative layer, and an amount of nitrogen to provide an effective amount of conductivity to an active area within the substrate.

66. A method of forming a semiconductor device, comprising the steps of:
    forming an insulative layer over a silicon-comprising substrate comprising an active area;
    forming an opening in the insulative layer to expose the active area of the substrate, the opening having sidewalls;
    forming a seed layer comprising titanium silicide over the insulative layer and the substrate within the opening; and
    forming a layer comprising titanium nitride over the seed layer to form a fill within the opening having a thickness of about 500 angstroms or greater;
    removing excess fill material overlying the insulative layer form a conductive contact within the opening; the contact having a concentration of chlorine and a thickness of about 500 angstroms or greater; and
    heating the conductive contact in a nitrogen-containing gas at a temperature of about 700° C. or greater to reduce the concentration of chlorine to less than about 3% by wt. throughout the thickness of the contact and without forming substantial cracks within the contact.

67. A method of forming a semiconductor device, comprising the steps of:
    forming an insulative layer over a silicon-comprising substrate comprising an active area;
    forming an opening in the insulative layer to expose the active area of the substrate, the opening having sidewalks;
    forming a seed layer comprising titanium silicide over the insulative layer and the substrate within the opening; and
    forming a layer comprising boron-doped titanium nitride over the seed layer to form a conductive fill within the opening;
    removing excess fill material overlying the insulative layer to form a conductive contact within the opening; the contact having a concentration of chlorine and a thickness of about 500 angstroms or greater; and
    heating the conductive contact in a nitrogen-containing gas at a temperature of about 700° C. or greater to reduce the concentration of chlorine to less than about 3% by wt. without forming substantial cracks within the contact;
    whereby the conductive contact comprises an amount of boron effective to provide the contact with a level of adhesion to the insulative layer within the opening to substantially eliminate peeling of the contact from the sidewalks of the opening, and a level of thermal stress to substantially eliminate cracking of the insulative layer; and an amount of nitrogen effective to maintain the conductivity of the contact at a predetermined level for an effective electrical contact with the active area.

68. A method of forming a semiconductor device, comprising the steps of:
    forming an insulative layer over a silicon-comprising substrate comprising a conductive area;
    forming an opening in the insulative layer to expose the conductive area of the substrate, the opening having sidewalls;
    forming a seed layer comprising titanium silicide over the insulative layer and the substrate within the opening; and
    filling the opening with alternating layers of titanium nitride and boron-doped titanium nitride material to form a fill having a thickness of at least about 500 angstroms within the opening;
    removing excess fill material overlying the insulative layer to form a conductive contact within the opening; the contact having a concentration of chlorine and a thickness of about 500 angstroms or greater; and heating the contact in a nitrogen-containing gas at a temperature of about 700° C. or greater to reduce the concentration of chlorine throughout the thickness of the contact to less than about 3% by wt. without forming substantial cracks within the contact;

wherein the boron-doped titanium nitride layer is interposed between two titanium nitride layers, and the boron-doped titanium nitride layer comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain the conductivity of the contact at a predetermined level for an effective electrical contact with the conductive area.

69. A method for filling high aspect ratio contact openings, comprising the steps of:

providing a substrate having a silicon-comprising substrate and an insulative layer formed thereon, the insulative layer having a surface and at least one contact opening formed therein to the substrate; the contact opening having an aspect ratio of at least 3:1;

forming a seed layer comprising titanium silicide over the insulative layer and the surface of the substrate within the contact opening; and forming a titanium nitride film over the seed layer to form a fill within the opening, the fill having a thickness of a least about 500 angstroms;

removing excess material overlying the insulative layer while leaving the titanium nitride film within the opening to form a conductive contact; the contact having a thickness of about 500 angstrom or greater and a concentration of chlorine without substantial cracks; and heating the contact in a nitrogen-containing gas at a temperature of about 700° C. or greater to reduce the concentration of chlorine throughout the thickness of the contact to less than about 3% by wt.

70. A method for filling high aspect ratio contact openings, comprising the steps of:

providing a substrate having a silicon-comprising substrate and an insulative layer formed thereon, the insulative layer having a surface and at least one contact opening formed therein to the substrate; the contact opening having an aspect ratio of at least 3:1;

forming a seed layer comprising titanium silicide over the insulative layer and the surface of the substrate within the contact opening; and forming a boron-doped titanium nitride film over the seed layer to form a fill within the opening having a thickness of about 500 angstroms or more;

removing excess fill material overlying the insulative layer while leaving the contact within the opening; the contact having a concentration of chlorine, a thickness of at least about 500 angstroms, and substantially no cracks; and heating the contact in a nitrogen-containing gas at a temperature of about 700° C. or greater to reduce the concentration of chlorine throughout the thickness of the contact to less than about 3% by wt.

71. A method for filling high aspect ratio contact openings, comprising the steps of:

providing a substrate having a silicon-comprising substrate and an insulative layer formed thereon, the insulative layer having a surface and at least one contact opening formed therein to the substrate; the contact opening having an aspect ratio of at least 3:1;

forming a seed layer comprising titanium silicide over the insulative layer and the surface of the substrate within the contact opening; and forming a multi-layered film over the seed layer to fill the opening, the film comprising a layer comprising boron-doped titanium nitride interposed between two layers comprising titanium nitride layer, and having a thickness of about 500 angstroms or greater;

removing excess of the film overlying the insulative layer while leaving the contact within the opening; the contact having a concentration of chlorine, a thickness of at least about 500 angstroms, and substantially no cracks; and heating the contact in a nitrogen-containing gas at a temperature of about 700° C. or greater to reduce the concentration of chlorine throughout the thickness of the contact to less than about 3% by wt.

72. A method of forming a conductive contact in an opening in an insulative layer, comprising the steps of:

filling the opening with a conductive material to form the conductive contact, the contact having a thickness of at least about 500 angstroms and comprising a component capable of diffusing into and corroding an adjacent metal layer thereto; and heating the contact in a reactive gas at a temperature of about 700° C. or greater reduce the component throughout the thickness of the contact by at least about 50% by wt, without forming substantial cracks within the contact.

73. A method of forming a conductive contact in an opening in an insulative layer, comprising the steps of:

filling the opening with a conductive material comprising chlorine to form the conductive contact, the contact having a thickness of at least about 500 angstroms; and heating the contact in a reactive gas at a temperature of about 700° C. or greater to reduce the component throughout the thickness of the contact without forming substantial cracks within the contact.

74. A method of forming a conductive contact in an opening in an insulative layer, comprising the steps of:

filling the opening with a conductive material comprising chlorine to form the conductive contact, the contact having a thickness of at least about 500 angstroms; and heating the contact in a nitrogen-containing gas at a temperature of about 700° C. or greater to reduce the component throughout the thickness of the contact without forming substantial cracks within the contact.

75. A method of forming a conductive contact in an opening in an insulative layer, comprising the steps of:

filling the opening with a titanium nitride material comprising chlorine to form the conductive contact, the contact having a thickness of at least about 500 angstroms; and heating the contact in a nitrogen-containing gas at a temperature of about 700° C. or greater to reduce the component throughout the thickness of the contact without forming substantial cracks within the contact.

76. A method of forming a conductive contact in an opening in an insulative layer, comprising the steps of:

filling the opening with a titanium boronitride material comprising chlorine to form the conductive contact, the contact having a thickness of about 500 angstroms or greater; and heating the contact in a nitrogen-containing gas at a temperature of about 700° C. or greater to reduce the component throughout the thickness of the contact without forming substantial cracks within the contact.

77. A method of forming a conductive contact in an opening in an insulative layer, comprising the steps of:
filling the opening with a conductive material to form the conductive contact by depositing sequential layers of titanium nitride and titanium boronitride into the opening, the conductive contact comprising a component capable of diffusing into and corroding an adjacent metal layer thereto and having a thickness of about 500 angstroms or greater; and
heating the contact in a reactive gas at a temperature of about 700° C. or greater to reduce the component throughout the thickness of the contact without forming substantial cracks within the contact.

78. A method of forming a conductive contact in an opening in an insulative layer, comprising the steps of:
filling the opening with a conductive material to form the conductive contact by depositing sequential layers of titanium nitride and titanium boronitride into the opening, the conductive contact comprising chlorine and having a thickness of about 500 angstroms or greater; and
heating the contact in a nitrogen-containing gas at a temperature of about 700° C. or greater to reduce the component throughout the contact without forming substantial cracks within the contact.

79. A method of forming a conductive contact in an opening in an insulative layer, comprising the steps of:
filling the opening with a conductive material to form the conductive contact by depositing overlying layers of titanium nitride and titanium boronitride into the opening, the conductive contact comprising chlorine and having a thickness of about 500 angstroms or greater; and
heating the contact in a nitrogen-containing gas at a temperature of about 700° C. or greater to reduce the component throughout the contact without forming substantial cracks within the contact.

80. A method of forming a conductive contact in an opening in an insulative layer disposed on a substrate, comprising the steps of:
forming a layer of titanium silicide on the substrate within the opening;
filling the opening with a conductive material to form the conductive contact, the contact having a thickness of about 500 angstroms or greater; and
heating the contact in a reactive gas at a temperature of about 700° C. or greater to remove from throughout the contact at least about 50% by wt. of a component capable of diffusing into and corroding an adjacent metal layer thereto without forming substantial cracks within the contact.

81. A method of forming a conductive contact in an opening in an insulative layer, the opening having an aspect ratio of about 3:1 or greater, the method comprising the steps of:
filling the opening with titanium boronitride to form the conductive contact having a thickness of about 200 angstroms or greater, the conductive contact comprising chlorine and having a thickness of about 500 angstroms or greater; and
heating the contact in a reactive gas at a temperature of about 700° C. or greater to remove from throughout the contact at least about 50% by wt. of a component capable of diffusing into and corroding an adjacent metal layer thereto without forming substantial cracks within the contact.

82. The method of claim 81, wherein the conductive contact has a thickness of about 1000 to about 3000 angstroms.

83. A method of forming a conductive contact in an opening in an insulative layer, comprising the steps of:
forming the conductive contact by depositing a gaseous mixture comprising titanium tetrachloride and ammonia into the opening, the contact having a thickness of about 500 angstroms or greater and comprising chlorine; and
heating the contact in a reactive gas at a temperature of about 700° C. or greater to remove at least about 50% by wt. of the chlorine from throughout the contact without forming substantial cracks within the contact.

84. A method of forming a conductive contact in an opening in an insulative layer, comprising the steps of:
forming the conductive contact by depositing a gaseous mixture comprising titanium tetrachloride, ammonia, and diborane into the opening, the contact having a thickness of about 500 angstroms or greater and comprising chlorine; and
heating the contact in a reactive gas at a temperature of about 700° C. or greater to remove at least about 50% by wt. of the chlorine from throughout the contact without forming substantial cracks within the contact.

85. A method of forming a conductive contact in an opening in an insulative layer, comprising the steps of:
forming the conductive contact by depositing a gaseous mixture comprising titanium tetrachloride and ammonia into the opening, the conductive contact comprising a concentration of chlorine and having a thickness of about 500 angstroms or greater; and
heating the contact in a reactive gas at a temperature of about 700° C. or greater to reduce the chlorine concentration by at least about 50% by wt. throughout the contact without forming substantial cracks within the contact.

86. The method of claim 85, wherein the gaseous mixture further comprises diborane.

87. A method of forming a conductive contact in an opening in an insulative layer, comprising the steps of:
forming the conductive contact by depositing a gaseous mixture comprising titanium tetrachloride and ammonia into the opening, the conductive contact comprising a concentration of chlorine and having a thickness of about 500 angstroms or greater; and
heating the contact in a reactive gas at a temperature of about 700° C. or greater to reduce the chlorine concentration to less than about 4% by wt. throughout the contact without forming substantial cracks within the contact.

88. A method of forming a conductive contact man opening in an insulative layer overlying a substrate, the opening having insulative sidewalls; the method comprising the steps of:
forming the conductive contact by depositing a gaseous mixture comprising titanium tetrachloride, ammonia and diborane into the opening, the conductive contact comprising a concentration of chlorine and having a thickness of about 500 angstroms or greater; and
heating the contact in a reactive gas at a temperature of about 700° C. or greater to reduce the chlorine concentration throughout the contact without forming substantial cracks within the contact;

wherein the contact comprises an amount of boron for effective adhesion of the contact to the insulative sidewalls of the opening to substantially eliminate peeling of the contact from the sidewalls and cracking of the insulative layer.

89. The method of claim 88, wherein the contact comprises a level of nitrogen for an effective level of conductivity to an active area within the substrate.

90. A method of forming a conductive contact in an opening in an insulative layer, comprising the steps of:
depositing a gaseous mixture comprising titanium tetrachloride and ammonia within the opening to form a layer of titanium nitride;
depositing a gaseous mixture comprising titanium tetrachloride, ammonia and diborane within the opening to form a layer of titanium boronitride over the titanium nitride layer;
depositing a gaseous mixture comprising titanium tetrachloride and ammonia within the opening to form a layer of titanium nitride over the titanium boronitride layer;
repeating the steps of depositing the gaseous mixtures to form sequential layers of titanium nitride and titanium boronitride to form the conductive contact to a thickness of about 500 angstroms or greater, the contact having a concentration of chlorine; and
heating the contact in a reactive gas at a temperature of about 700° C. or greater to reduce the chlorine concentration throughout the contact without forming substantial cracks within the contact.

91. A method of forming a barrier layer on a substrate, comprising the steps of:
forming a layer of titanium nitride over the substrate, the titanium nitride layer having a thickness of at least about 500 angstroms and comprising a concentration of chlorine; and
heating the titanium nitride layer in a reactive gas at a temperature of about 700° C. or greater to reduce the chlorine concentration throughout the titanium nitride layer by at least about 50% without forming substantial cracks within the titanium nitride layer.

92. A method of forming a barrier layer on a substrate, comprising the steps of:
depositing a gaseous mixture comprising titanium tetrachloride and ammonia to form the barrier layer on the substrate, the barrier layer having a thickness of at least about 500 angstroms and a concentration of chlorine; and
heating the barrier layer in a reactive gas at a temperature of about 700° C. or greater to reduce the chlorine concentration throughout the barrier layer by at least about 50% without forming substantial cracks within the barrier layer.

93. A method of forming a barrier layer on a substrate, comprising the steps of:
forming a layer of titanium boronitride over the substrate, the titanium boronitride layer having a thickness of at least about 500 angstroms and a concentration of chlorine; and
heating the titanium boronitride layer in a reactive gas at a temperature of about 700° C. or greater to remove at least about 50% of the chlorine throughout the titanium boronitride layer without forming substantial cracks within the titanium boronitride layer.

94. A method of forming a barrier layer on a substrate, comprising the steps of:
depositing a gaseous mixture comprising titanium tetrachloride, ammonia and diborane to form the barrier layer on the substrate, the barrier layer having a thickness of at least about 500 angstroms and a concentration of chlorine; and
heating the barrier layer in a reactive gas at a temperature of about 700° C. or greater to remove at least about 50% of the chlorine from throughout the barrier layer without fanning substantial cracks within the barrier layer.

95. A method of forming a semiconductor device, comprising the steps of:
forming a layer of titanium nitride over a substrate, the titanium nitride layer having a thickness of at least about 500 angstroms and a concentration of chlorine;
heating the titanium nitride layer in a reactive gas at a temperature of about 700° C. or greater to remove at least about 50% of the chlorine from throughout the titanium nitride layer without forming substantial cracks within the titanium nitride layer; and
depositing a conductive layer over the titanium nitride layer.

96. The method of claim 95, wherein the conductive layer comprises an interconnect.

97. The method of claim 96, wherein the interconnect comprises aluminum.

98. A method of forming a semiconductor device, comprising the steps of:
depositing a gaseous nurture comprising titanium tetrachloride and ammonia on a substrate to form a layer of titanium nitride, the titanium nitride layer having a thickness of at least about 500 angstroms and a concentration of chlorine;
heating the titanium nitride layer in a reactive gas at a temperature of about 700° C. or greater to remove at least about 50% of the chlorine from throughout the titanium nitride layer without forming substantial cracks within the titanium nitride layer; and
depositing a conductive layer over the titanium nitride layer.

99. A method of forming a semiconductor device, comprising the steps of:
forming a layer of titanium boronitride over a substrate, the titanium boronitride layer having a thickness of at least about 500 angstroms and a concentration of chlorine; and
heating the titanium boronitride layer in a reactive gas at a temperature of about 700° C. or greater to remove at least about 50% by wt. of the chlorine from throughout the titanium boronitride layer without forming substantial cracks within the titanium boronitride layer; and
depositing a conductive layer over the titanium boronitride layer.

100. A method of forming a semiconductor device, comprising the steps of:
depositing a gaseous mixture comprising titanium tetrachloride, ammonia and diborane on a substrate to form a layer of titanium boronitride having a thickness of at least about 500 angstroms and a concentration of chlorine;
heating the titanium boronitride layer in a reactive gas at a temperature of about 700° C. or greater to remove at least about 500% by wt. of the chlorine from throughout the layer without forming substantial cracks within the titanium nitride layer; and
depositing a conductive layer over the titanium boronitride layer.

* * * * *

UNITED STATES PATENT AND TRADEMARK OFFICE
CERTIFICATE OF CORRECTION

PATENT NO. : 7,067,416 B2  Page 1 of 1
APPLICATION NO. : 09/941533
DATED : June 27, 2006
INVENTOR(S) : Ammar Derraa It is certified that error appears in the above-identified patent and that said Letters Patent is hereby corrected as shown below:

Column 13, line 20: Replace "through" with --throughout--.
Column 16, line 11: Replace "farm" with --form--.
Column 17, line 12: Replace "aver" with --over--.
Column 17, line 26: Replace "farming" with --forming--.
Column 17, line 42: Replace "aver" with --over--.
Column 18, lines 24-25: Replace "sidewalks" with --sidewalls--.
Column 18, line 45: Replace "sidewalks" with --sidewalls--.
Column 22, line 55: Replace "man" with --in an--.
Column 24, line 7: Replace "fanning" with --forming--.
Column 24, line 26: Replace "nurture" with --mixture--.
Column 24, line 59: Replace "500%" with --50%--.

Signed and Sealed this

Seventh Day of November, 2006

JON W. DUDAS
*Director of the United States Patent and Trademark Office*